(12) United States Patent
Asano et al.

(10) Patent No.: US 7,626,232 B2
(45) Date of Patent: Dec. 1, 2009

(54) VOLTAGE-CONTROLLED SEMICONDUCTOR DEVICE

(75) Inventors: Katsunori Asano, Osaka (JP); Yoshitaka Sugawara, Osaka (JP)

(73) Assignee: The Kansai Electric Power Co., Inc., Osaka-shi, Osaka (JP)

( * ) Notice: Subject to any disclaimer, the term of this patent is extended or adjusted under 35 U.S.C. 154(b) by 609 days.

(21) Appl. No.: 10/593,878

(22) PCT Filed: Mar. 17, 2005

(86) PCT No.: PCT/JP2005/004834

§ 371 (c)(1),
(2), (4) Date: Sep. 22, 2006

(87) PCT Pub. No.: WO2005/091372

PCT Pub. Date: Sep. 29, 2005

(65) Prior Publication Data

US 2007/0200150 A1   Aug. 30, 2007

(30) Foreign Application Priority Data

Mar. 22, 2004   (JP)   ............... 2004-083233

(51) Int. Cl.
*H01L 29/94* (2006.01)
(52) U.S. Cl. .............. 257/341; 257/E21.382; 257/E29.198; 257/E29.197
(58) Field of Classification Search ............... 257/341, 257/E21.382–E21.386, E29.197, E29.198, 257/E29.2, E29.066; 438/133
See application file for complete search history.

(56) References Cited

U.S. PATENT DOCUMENTS 5,917,204 A   6/1999   Bhatnagar et al.
2004/0104429 A1*   6/2004   Takahashi et al. ........... 257/338

FOREIGN PATENT DOCUMENTS

JP   10-27899   1/1998

(Continued)

OTHER PUBLICATIONS

English translation of the International Preliminary Report on Patentability mailed Oct. 5, 2006 in corresponding PCT Application No. PCT/JP2005/004834.

(Continued)

*Primary Examiner*—Zandra Smith
*Assistant Examiner*—Paul E Patton
(74) *Attorney, Agent, or Firm*—Nixon & Vanderhye, P.C.

(57) ABSTRACT

SiC-IGBTs, which have an inversion-type channel with high channel resistance and have high on-voltage due to an influence from the surface state of the interface between a gate insulating film and a base layer, are required to decrease the on-voltage.

An embedded collector region is partially formed in a base layer which is formed on an emitter layer of a SiC semiconductor. A channel layer is formed on the base layer and the embedded collector region to constitute an accumulation-type channel. Consequently, at on time, holes are accumulated in the upper layer portion of the channel layer so that a low-resistant channel is formed. Current by the holes flows to the emitter layer through a channel from the collector region and becomes a base current for an npn transistor composed of the embedded collector region, the base region and the emitter region.

13 Claims, 7 Drawing Sheets

FOREIGN PATENT DOCUMENTS

| | | |
|---|---|---|
| JP | 10-256529 | 9/1998 |
| JP | 10-284733 | 10/1998 |
| JP | 2001-291869 | 10/2001 |
| JP | 2002-231947 | 8/2002 |
| JP | 2003-31802 | 1/2003 |

OTHER PUBLICATIONS

International Search Report of PCT/JP2005/004834 mailed Jun. 28, 2005.

Ryu et al., "High-Power P-Channel UMOS IGBT'S in 6H-SiC for High Temperature Operation", Materials Science Forum, vols. 338-342, pp. 1427-1430 (2000).

* cited by examiner

VOLTAGE-CONTROLLED SEMICONDUCTOR DEVICE

This application is the U.S. national phase of international application PCT/JP2005/004834 filed 17 Mar. 2005, which designated the U.S. and claimed priority of JP 2004-083233 filed 22 Mar 2004, the entire contents of each of which are hereby incorporated by reference.

TECHNICAL FIELD

The present invention relates to a power semiconductor for controlling large current, and more particularly relates to a voltage-controlled semiconductor device such as insulated-gate bipolar transistors having high breakdown voltage.

BACKGROUND ART

As semiconductor devices for controlling large current, though power semiconductor devices using Si (silicon) as a semiconductor material have conventionally been used, the improvement of their performance is difficult since Si has a limit in electrical and physical characteristics. Accordingly, development of power semiconductor devices with use of wide gap semiconductor materials having good electrical and physical characteristics compared to Si are currently proceeding. The wide gap semiconductor materials are typified by SiC (silicon carbide) having an energy gap of 2.2 eV to 3.2 eV. An insulated-gate bipolar transistor (IGBT) that is a voltage-controlled semiconductor device with use of the SiC is disclosed in, for example, Material Science Forum Vols. 338-342 (2000), pp. 1427-1430. This SIC-IGBT is shown in FIG. 7.

In FIG. 7, a p-type SiC buffer layer 102, a p-type SiC base layer 103, an n-type SiC base layer 104, and a p+ type SiC emitter layer 105 are sequentially formed by epitaxial growth method on an n+ type SiC substrate 101 having an emitter electrode 113 formed on the lower surface and connected to an emitter terminal 113a. A trench 109 reaching the base layer 103 is formed in the central portion of the SiC-IGBT, and a gate electrode 111 connected to a gate terminal 111a is provided in the trench 109 via a gate insulating film 106. On both the sides of the SiC-IGBT, a collector electrode 115 which is in contact with the base layer 104 and the emitter layer 105 are provided, and the collector electrode 115 is connected to a collector terminal 115a.

Upon application of a voltage to between the gate electrode 111 and the collector electrode 115 so as to make the potential of the gate electrode 111 negative, electric fields are given to the gate insulating film 106 placed in between a portion of the base layer 104 forming a lateral wall of the trench 109 and the gate electrode 111. As a result, in the vicinity of a contact surface of the n-type base layer 104 in contact with the gate insulating film 106, an n-type conductivity is inverted to a P type. Since a channel for current flow is formed in a portion of the base layer 104 which is an inversion layer inverted to the P type, the channel is referred to as "inversion-type" channel. Through the channel, current flows between the collector electrode 115 and the emitter electrode 113.

In the case of the SiC-IGBT, there is a problem that the inversion layer has low channel mobility. This is considered to be because a surface state is present in the interface between $SiO_2$ used as the gate insulating film and SiC so that the holes flowing through the inversion layer at on time are captured by the surface state. Further, it is also considered that roughness of the interface causes the holes as carriers to stop contributing to the conductivity, which causes the low mobility of the holes in the channel. Because of these reasons, channel resistance and on-voltage tend to increase.

(Patent Document 1) JP H10-256529 A
(Patent Document 2) JP H10-27899 A
(Non-patent Document 1) Trans Tech Publication (Switzerland) Material Science Forum Vols. 338-342 (2000), PP1427 to 1430

DISCLOSURE OF THE INVENTION

Problems to be Solved by the Invention

In a SiC-IGBT in the conventional example shown in FIG. 7, due to the influence from the surface state in the interface between the gate insulating film 106 and the base layer 104, an inversion-type channel has high channel resistance. Accordingly, there is a problem in that the IGBT has high on-resistance at on time and thereby has high on-voltage. It is a primary object of the present invention to provide a voltage-controlled semiconductor device having low on-voltage.

Means for Solving the Problems

In order to achieve the above object, there is provided a voltage-controlled semiconductor device, comprising:

a first semiconductor layer made of a first conductivity-type wide gap semiconductor having a first electrode on one surface, the first electrode becoming either one of a current inflow terminal and a current outflow terminal for a controlled current;

a second semiconductor layer made of a wide gap semiconductor which is formed on the other surface of the first semiconductor layer and which has a second conductivity-type different from the first conductivity type;

an embedded semiconductor region made of a wide gap semiconductor which is partially provided in a vicinity of an opposite surface of the second semiconductor layer to a surface being in contact with the first semiconductor layer and which has a conductivity type different from that of the second semiconductor layer;

a channel layer made of a wide gap semiconductor which is provided so as to be in contact with the second semiconductor layer and the embedded semiconductor region and which has a conductivity type identical to that of the second semiconductor layer;

a semiconductor region made of a wide gap semiconductor which is provided in the channel layer so as to be overlapped with the embedded semiconductor region and which has a conductivity type identical to that of the channel layer and a dopant concentration larger than that of the channel layer;

a second electrode electrically connected to the embedded semiconductor region and to the semiconductor region, the second electrode becoming a current outflow end when the first semiconductor layer becomes a current inflow end while the second electrode becoming a current inflow end when the first semiconductor layer becomes a current outflow end; and a control electrode facing the channel layer and the semiconductor region via an insulating film.

According to the present invention, in the voltage-controlled semiconductor device using a wide gap semiconductor, an embedded semiconductor region is provided in the vicinity of the surface of the second semiconductor layer which is in contact with the channel layer, the channel layer facing the control electrode via the insulating film. Consequently, without application of a voltage to between the control electrode and the second electrode at off time, current can be blocked by a built-in voltage of the Sic semiconductor. That is, the normally-off characteristic, i.e., capability of maintaining the off-state, can be implemented. At on time, holes are flowed from the channel layer into the second semiconductor layer so that a base current is fed to an npn transistor composed of the embedded semiconductor region, the second semiconductor layer and the first semiconductor layer, while a main current is flowed from the semiconductor region into the first semiconductor layer. Moreover, by widening an interval between adjacent embedded semiconductor regions, conductivity modulation occurs in the base layer or the channel layer so that the resistance in the second semiconductor layer can be reduced considerably. This can lead to considerable reduction of the on-voltage.

There is also provided a voltage-controlled semiconductor device, comprising:

a first semiconductor layer made of a first conductivity-type wide gap semiconductor having a first electrode on one surface, the first electrode becoming either one of a current inflow terminal and a current outflow terminal for a controlled current;

a second semiconductor layer made of a wide gap semiconductor which is formed on the other surface of the first semiconductor layer and which has a second conductivity-type different from the first conductivity type;

at least two embedded semiconductor regions made of a wide gap semiconductor which is partially provided in a vicinity of an opposite surface of the second semiconductor layer to a surface being in contact with the first semiconductor layer and which has a conductivity type different from that of the second semiconductor layer;

a channel layer made of a wide gap semiconductor which is provided so as to be in contact with the second semiconductor layer and the embedded semiconductor regions and which has a conductivity type identical to that of the second semiconductor layer;

a semiconductor region made of a wide gap semiconductor which is provided in the channel layer so as to be overlapped with the embedded semiconductor regions and which has a conductivity type identical to that of the channel layer and a dopant concentration larger than that of the channel layer;

a second electrode electrically connected to the embedded semiconductor regions and to the semiconductor region, the second electrode becoming a current outflow end when the first semiconductor layer becomes a current inflow end while the second electrode becoming a current inflow end when the first semiconductor layer becomes a current outflow end; and a control electrode facing the second semiconductor layer, the channel layer and the semiconductor region via an insulating film.

According to the present invention, in the voltage-controlled semiconductor device using a wide gap semiconductor, at least another first conductivity-type electric field relaxation layer is provided onto the second conductivity-type second semiconductor layer placed between the first conductivity-type embedded semiconductor regions. This allows considerable reduction of maximum electric fields applied to the insulating film at off time. Moreover, on the second conductivity-type second semiconductor layer placed between the first conductivity-type embedded semiconductor regions, a control electrode facing the second semiconductor layer via the insulating film is provided. This makes it possible to increase inflow of holes to the second semiconductor layer. The inflow of the holes to the second semiconductor layer leads to the increase of current passing through the second semiconductor layer, which allows further reduction of the on-voltage.

Effects of the Invention

The voltage-controlled semiconductor device of the present invention has a channel layer which faces a gate electrode via a gate insulating film and a base layer in contact with the channel layer, the base layer being partially provided with a plurality of embedded collector regions. At on time, holes are accumulated in the channel layer in the vicinity of the gate insulating film, resulting in formation of a low-resistant channel, through which a large base current is fed to a transistor composed of the embedded collector region, the base layer and the emitter layer. This causes conductivity modulation inside the base layer. As a result, a voltage-controlled semiconductor device having low on-resistance, i.e., low on-voltage, can be provided.

REFERENCE NUMERAL

Figure 1:
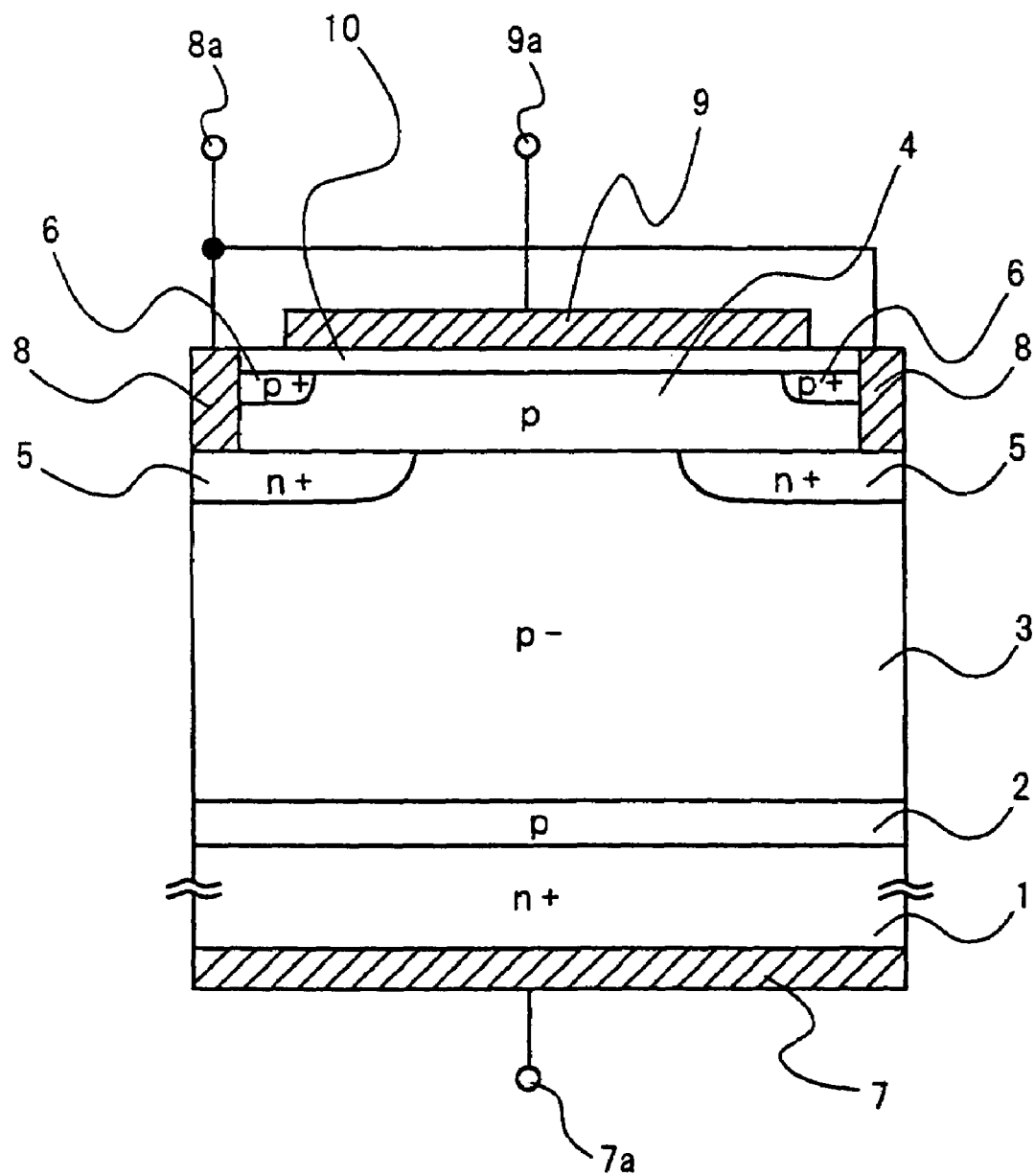
FIG. 1 is a cross sectional view showing an insulated-gate bipolar transistor in a first embodiment of the present invention.

1: emitter layer
2: buffer layer
3: base layer
4, 4a: channel layer
5: embedded collector region
6: collector region
7: emitter electrode
8: collector electrode
9: gate electrode
10, 10a, 10b: gate insulating film
15: trench
55, 56: electric field relaxation region

DETAILED DESCRIPTION OF THE INVENTION

Preferred embodiments of a voltage-controlled semiconductor device in the present invention will now be described with reference to FIG. 1 through FIG. 6.

FIRST EMBODIMENT

A voltage-controlled semiconductor device in a first embodiment of the present invention will hereinbelow be described with reference to FIG. 1. FIG. 1 is a cross sectional view showing a segment of the voltage-controlled semiconductor device in the first embodiment, i.e., a SiC insulated-gate bipolar transistor (SiC-IGBT) with use of a Sic semiconductor and with a breakdown voltage of 10 kV. Although the segment of the present invention has a band shape elongated in the direction perpendicular to the page, the segment may take other shapes such as circles and squares.

In FIG. 1, a buffer layer 2 made of a p-type SiC semiconductor with a thickness of approx. 3 μm and a dopant concentration of approx. $1 \times 10^{17}$ cm$^{-3}$ is formed on an emitter layer 1 (first semiconductor layer) as a substrate made of an n-type 4H-SiC semiconductor with a thickness of approx. 300 μm and with a high dopant concentration, the emitter layer 1 having an emitter electrode 7 (first electrode) made of gold, copper or the like on the lower surface thereof. The emitter electrode 7 is connected to an emitter terminal 7a. Formed on the buffer layer 2 is a base layer 3 (second semiconductor layer) made of a p-type SiC semiconductor with a thickness of approx. 100 μm and a dopant concentration of $1 \times 10^{13}$ cm$^{-3}$ to $5 \times 10^{15}$ cm$^{-3}$. Formed on both upper end portions of the base layer 3 is an embedded collector region 5 (embedded semiconductor region) made of n+type SiC semiconductor with a dopant concentration of $1 \times 10^{18}$ cm$^{-3}$ to $1 \times 10^{19}$ cm$^{-3}$ achieved by ion implantation and the like. Formed on the embedded collector region 5 and the base layer 3 is a channel layer 4 made of a p-type SiC semiconductor with a dopant concentration of $1 \times 10^{14}$ cm$^{-3}$ to $3 \times 10^{16}$ cm$^{-3}$. The thickness of the channel layer 4 is approx. 0.2 μm to 2 μm. The thickness, which is determined by depending on the dopant concentration of the channel layer 4, may be smaller or larger than the above value in some cases.

In this embodiment, the dopant concentration of the channel layer 4 is larger than the dopant concentration of the base layer 3. However, the dopant concentration of the channel layer 4 may be smaller than the dopant concentration of the base layer 3. The dopant concentration of the channel layer 4 may also be equal to the dopant concentration of the base layer 3, and in such a case, by forming the embedded collector region 5 inside the base layer 3 by ion implantation, the base layer 3 and the channel layer 4 can be formed in the same step. Formed on upper end portions of the channel layer 4 is a collector region 6 (semiconductor region) made of a p+type SiC semiconductor with a dopant concentration of approx. $1 \times 10^{19}$ cm$^{-3}$. The collector region 6 is shorter in the transverse direction than the embedded collector region 5. A gate insulating film 10 (insulating film) is formed on both the collector regions 6 and the channel layer 4, and a gate electrode 9 (control electrode) connected to a gate terminal 9a is provided on the gate insulating film 10. A collector electrode 8 (second electrode) connected to a collector terminal 8a is provided so as to be in contact with a lateral surface of the collector region 6 and with an upper surface of the embedded collector region 5. The collector electrode 8 and the gate electrode 9 are formed from metal films made of gold, copper or the like.

In the SIC-IGBT in the present embodiment, when a voltage is applied to between the emitter electrode 7 and the collector electrode 8 so that the potential of the collector electrode 8 is high and then the potential of the gate electrode 9 is set to be lower than the potential of the collector electrode 8, the SIC-IGBT is turned on and a main current flows to between the collector electrode 8 and the emitter electrode 7.

In order to turn off the SiC-IGBT in the on state, the voltage between the gate electrode 9 and the collector electrode 8 is set at 0, or the potential of the gate electrode 9 is set to be positive with respect to the collector electrode 8 in the state that the potential of the collector electrode 8 is higher than the potential of the emitter electrode 7. As a result, with a built-in voltage of the SiC semiconductor, a depletion layer spreads in the channel layer 4 from a junction between the embedded collector region 5 and the channel layer 4, which brings the channel layer 4 in a pinch-off state. Consequently, the current flowing from the collector region 6 to the emitter layer 1 is blocked, as a result of which the SiC-IGBT is put in an off state, i.e., a normally-off state. By applying a voltage to between the gate electrode 9 and the collector electrode 8 with the gate electrode 9 being positive, a leak current between the collector electrode 8 and the emitter electrode 7 can be reduced.

When a voltage is applied to between the gate electrode 9 and the collector electrode 8 with the gate electrode 9 being negative at the turn-on of the SiC-IGBT, holes are accumulated in an upper layer portion of the channel layer 4 close to the gate insulating film 10, resulting in formation of a low-resistant channel. A current by the holes flows from the collector region 6 through the channel and travels in between both the embedded collector regions 5 to the emitter layer 1. This current is a base current for an npn transistor composed of the embedded collector region 5, the base layer 3 and the emitter layer 1. The main current flows through the collector electrode 8, the embedded collector region 5, the base layer 3, the emitter layer 1 and the emitter electrode 7. Electrons flow from the emitter layer 1 to the embedded collector region 5 through the buffer layer 2 and the base layer 3. The holes go into the base layer 3 from the collector region 6 through the channel and travels from the base layer 3 to the emitter layer 1. Electrons corresponding to the base current go into the base layer 3 from the emitter layer 1 and reach the embedded collector region 5. By widening an interval between the adjacent embedded collector regions 5, conductivity modulation is induced in the base layer 3 by the holes and the electrons coming into the base layer 3 from the embedded collector region 5, by which the resistance of the base layer 3 is considerably reduced.

In the structure of the present embodiment, an "accumulation-type" operation is performed in which holes are accumulated in the channel layer 4. In the accumulation-type operation, channel resistance is smaller than that in the "inversion-type" operation described in the BACKGROUND ART. In the conventional IGBT in FIG. 5, the main current flows through an inversion-type channel on the lateral wall of the gate insulating film, and this causes large voltage drop in the channel portion. However, in the SiC-IGBT in the present embodiment, the main current does not flow through the channel layer 4 but only a gate current flows therethrough, so that the voltage drop in the channel layer 4 can be kept small. Moreover, since the embedded collector region 5 has high dopant concentration and small resistance, the voltage drop in this region is small. While the dopant concentration of the channel layer 4 may be equal to that of the base layer 3, setting the dopant concentration of the channel layer 4 higher than the dopant concentration of the base layer 3 puts the inside of the base layer 3 and the channel layer 4 in a low-resistant state at on time. Since the base current flows through these regions, the voltage drop during passage of the base current can be decreased. As a result, the base current is increased, and thereby an output current can be increased. That is, it becomes possible to decrease the on-voltage. Moreover, since the voltage drop is small, there is little possibility for occurrence of latch-up phenomenon in which control by the gate electrode 9 is failed in a thyristor structure internally formed in the SiC-IGBT by the channel layer 4, the embedded collector region 5, the base layer 3, the buffer layer 2 and the emitter layer 1.

When a main current with a current density of 100 A/cm² was applied to between the collector electrode 8 and the emitter electrode 7 in the SiC-IGBT in the present embodiment, the on-voltage was 3.5 V, which was considerably lower than 9.5 V, the on-voltage of the conventional SiC-IGBT. Although in the present invention, an interval between the adjacent embedded collector regions 5 was 3 μm or more, increasing the interval to 10 μm decreased the resistance between the embedded collector regions 5. Consequently, the base current flowing from the collector region 6 through the channel layer 4 became larger, and this increased the main current. As a result, the on-voltage was further decreased to 3.2 V.

Although the embedded collector region 5 is formed by ion implantation in the present embodiment, an embedded collector region similar to the embedded collector region 5 in the present embodiment can be formed by the steps of forming an n+ region through epitaxial method and etching away the region except a necessary portion. In this case, the channel layer 4 on the embedded collector region 5 has sufficient crystallinity and high channel mobility compared to the channel layer 4 in the case of ion implantation.

SECOND EMBODIMENT

Figure 2:
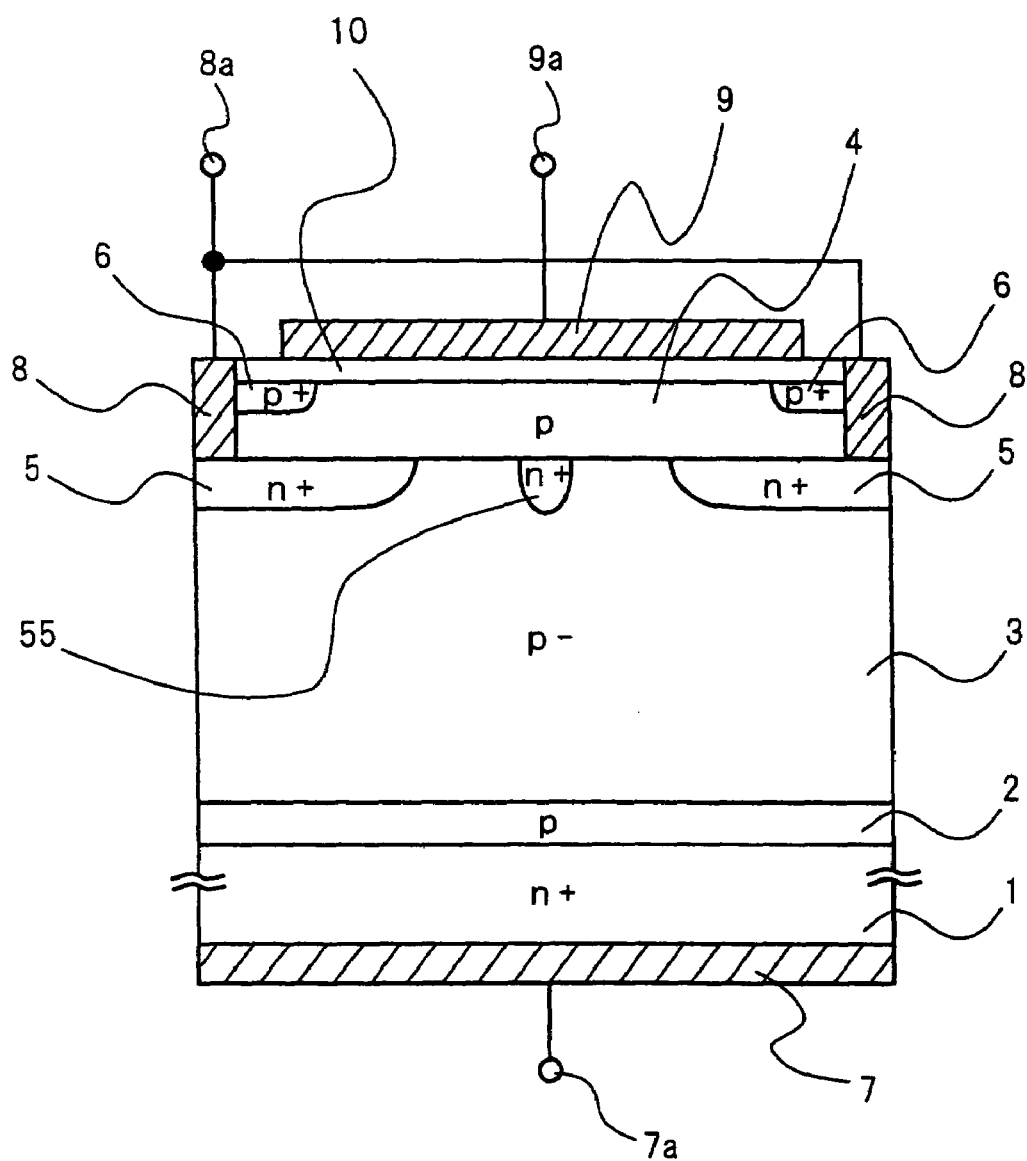
FIG. 2 is a cross sectional view showing an insulated-gate bipolar transistor in a second embodiment of the present invention.

FIG. 2 is a cross sectional view showing a segment of a voltage-controlled semiconductor device in a second embodiment of the present invention, i.e., an insulated-gate bipolar transistor (SiC-IGBT) with use of a SiC semiconductor and with a breakdown voltage of 10 kV. In FIG. 2, the SiC-IGBT in the present embodiment is different from the first embodiment in the point that at least one electric field relaxation region 55 made of an n+ SiC semiconductor is provided in the base layer 3 between the adjacent embedded collector regions 5. Other structural features are similar to those of the first embodiment. The dopant concentration of the electric field relaxation region 55 may be identical to that of the embedded collector region 5. In that case, the electric field relaxation region 55 and the embedded collector region 5 can be manufactured in the same step, so that simplification of the steps can be achieved. With the electric field relaxation region 55 provided between the adjacent embedded collector regions 5, a depletion layer spreads in the base layer 3 from a junction between the electric field relaxation region 55 and the base layer 3 at off time of the SiC-IGBT, and therefore a collector-emitter voltage can be shared. As a result, it becomes possible to relax the electric field intensity applied to the gate insulating film 10.

While the maximum electric field intensity of the gate insulating film 10 at off time was 2.1 MV/cm in the SiC-IGBT in the first embodiment, the maximum electric field intensity in the SiC-IGBT in the second embodiment was 0.7 MV/cm, which was approx. 67% reduction from the first embodiment. In addition to the low on-voltage, which is the characteristic of the SiC-IGBT in the first embodiment, the SiC-IGBT in the second embodiment has a characteristic in which the electric field intensity of the gate insulating film 10 is relaxed, so that it becomes possible to enhance long-term reliability of the IGBT.

THIRD EMBODIMENT

Figure 3:
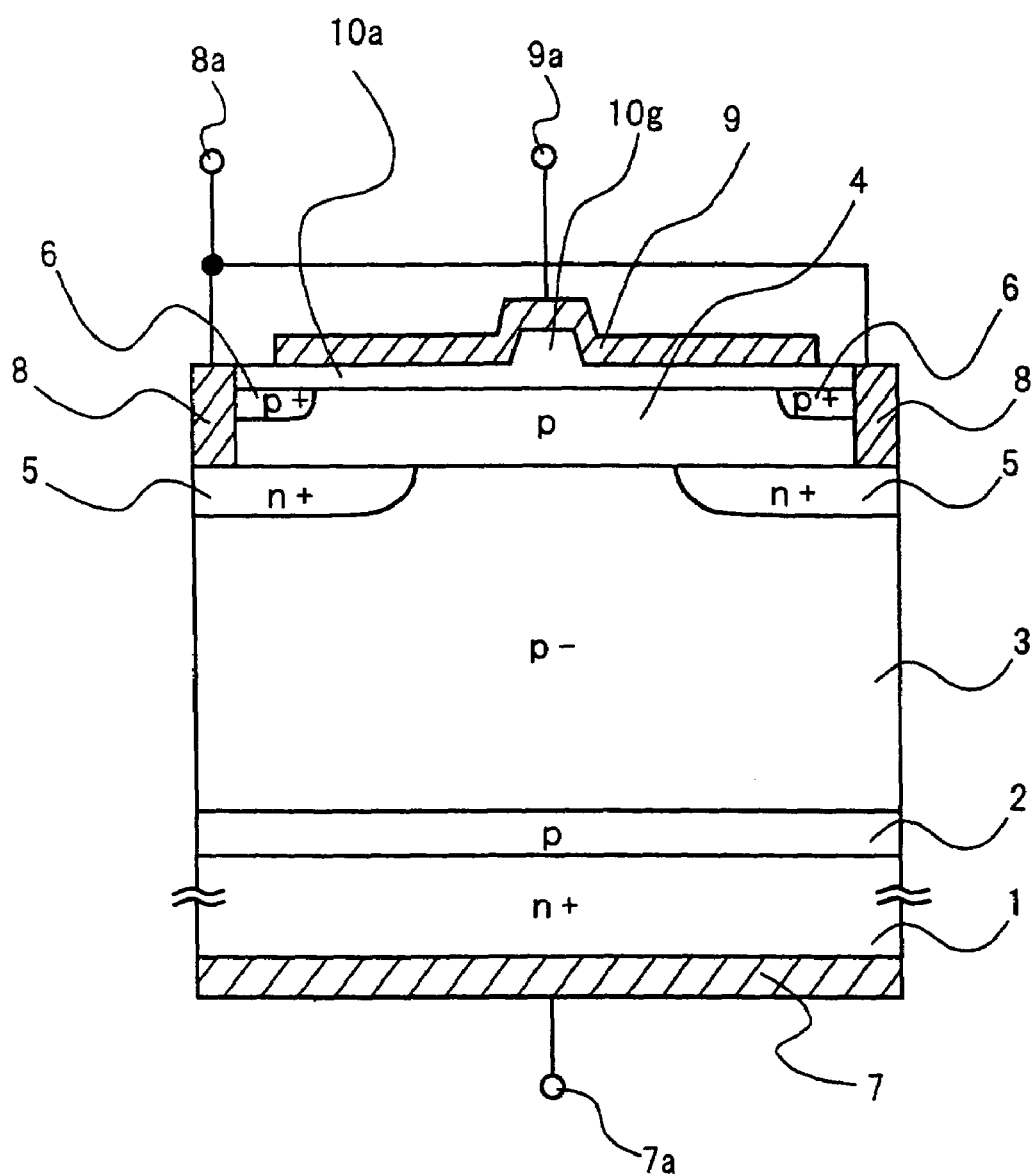
FIG. 3 is a cross sectional view showing an insulated-gate bipolar transistor in a third embodiment of the present invention.

FIG. 3 is a cross sectional view showing a segment of a voltage-controlled semiconductor device in a third embodiment of the present invention, i.e., an insulated-gate bipolar transistor (SiC-IGBT) with use of a SiC semiconductor and with a breakdown voltage of 10 kV. In FIG. 3, the SiC-IGBT in the present embodiment is different from the first embodiment shown in FIG. 1 in the point that the thickness of a gate insulating film 10a on the portion in between the adjacent embedded collector regions 5 is larger than that of other portions. Other structural features are similar to those of the first embodiment shown in FIG. 1.

The inventors of the present invention have found out that in the SiC-IGBT in the first embodiment, a central portion 10g of the gate insulating film 10a facing the base layer 3 between the adjacent embedded collector regions 5 was higher in electric field intensity than other portions of the gate insulating film 10a at off time. The reason thereof is considered to be as follows.

In the voltage-controlled semiconductor device in the first embodiment, in order to achieve effective passage of a base current from the collector region 6 to the embedded collector region 5, an accumulation layer is formed in the range from the upper side of the embedded collector regions 5 up to as close as to a central region on an interval between the adjacent embedded collector regions 5. This decreases voltage drop during the passage of the base current. Further, the interval between the adjacent embedded collector regions 5 is widened so that conductivity modulation sufficiently occurs in the base layer 3.

While a depletion layer spreads from a junction between the embedded collector region 5 and the base layer 3 at off time, the depletion layer does not fully spread in the vicinity of the central region between the embedded collector regions 5 since the interval therebetween is wide. Consequently, the collector voltage is not shared by the depletion layer, by which the central portion 10g of the gate insulating film 10a has a high electric field. More specifically, at off time, the depletion layer spreading to the base layer 3 and the channel layer 4 from the junction between the embedded collector region 5 and the base layer 3 shares the voltage between the collector region 6 and the emitter layer 1. However, the depletion layer does not fully spread in the central portions of the base layer 3 and the channel layer 4 placed between the adjacent embedded collector regions 5, as a result of which high electric fields are easily applied to the central portion 10g of the gate insulating film 10a. Accordingly, the thickness of the central portion 10g of the gate insulating film 10a is made larger than that of other portions so as to enhance electric field intensity withstand characteristics. This makes it possible to reduce the maximum electric field intensity applied to the gate insulating film 10a at off time.

In the present embodiment shown in FIG. 3, the thickness of the central portion 10g in the gate insulating film 10a with a thickness of approx. 0.1 μm is set at approx. 0.5 μm, which is about five times larger than that of other portions. This makes it possible to reduce approx. 70% of the maximum electric field intensity applied to the central portion 10g of the gate insulating film 10a at off time.

While the thickness of the gate insulating film 10a influences the channel resistance, the channel resistance needs to be small for effective passage of the base current from the collector region 6 to the base layer 3 at on time. Therefore, the gate insulating film 10a should preferably be thin so that holes are fully accumulated in the upper side of the channel layer 4. In the present embodiment, only the central portion 10g of the gate insulating film 10a, to which high electric fields are easily applied, is given a large thickness while the other portions have an unchanged thickness, and this makes it possible to obtain the SiC-IGBT with a low on voltage and a high breakdown voltage with the structure almost identical to that of the SiC-IGBT in the first embodiment.

FOURTH EMBODIMENT

Figure 4:
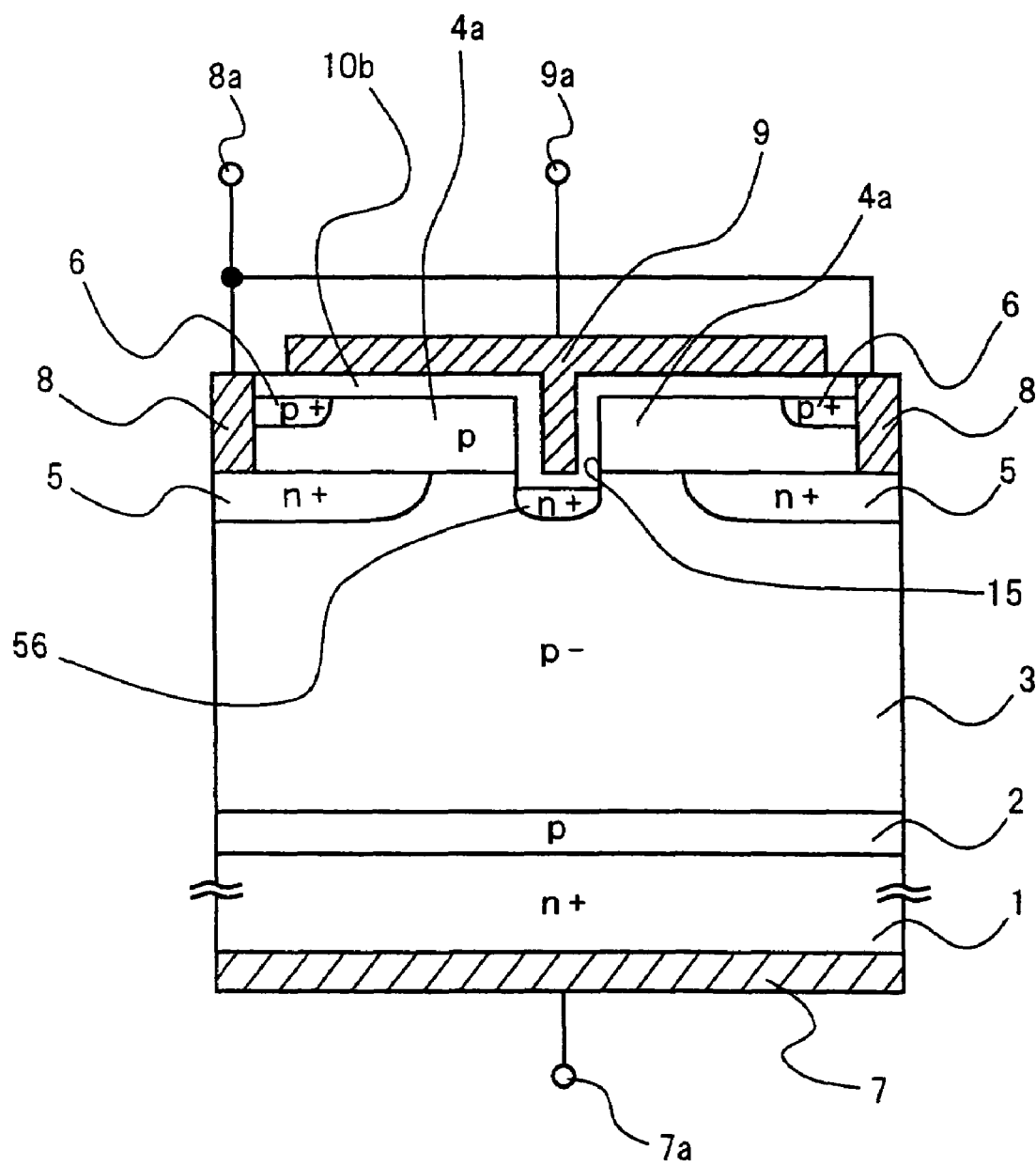
FIG. 4 is a cross sectional view showing an insulated-gate bipolar transistor in a fourth embodiment of the present invention.

FIG. 4 is a cross sectional view showing a segment of a voltage-controlled semiconductor device in a fourth embodiment of the present invention, i.e., an insulated-gate bipolar transistor (SiC-IGBT) with use of a SiC semiconductor and with a breakdown voltage of 10 kV. In FIG. 4, the SiC-IGBT in the present embodiment has a trench 15 provided in the central portion of the SiC-IGBT, the trench 15 extending through a channel layer 4a and going into the base layer 3. An electric field relaxation layer 56 made of an n+ SiC semiconductor is provided on the bottom portion of the trench 15. Though the electric field relaxation layer 56 should preferably be narrower than the width of the trench 15, it is acceptable that the electric field relaxation layer 56 is wider than the width of the trench 15. A gate insulating film 10b is provided on the lateral wall of the trench 15 and on the electric field relaxation layer 56. A gate electrode 9 is provided inside the trench 15 via the gate insulating film 10b. The gate electrode 9 faces the upper surface of the channel layer 4a via the gate insulating film 10b while facing the lateral surface of the channel layer 4a inside the trench 15 via the gate insulating film 10b. Other structural features are identical to those in the first embodiment shown in FIG. 1.

In the SiC-IGBT in the present embodiment, an accumulation layer formed in the channel layer 4a below the gate insulating film 10b at on time is formed in a region extending down through the channel layer 4a and reaching the upper side of the lower base layer 3, so that the base current can be increased and the on-voltage can be further decreased compared to the on-voltage in the first to third embodiments. Moreover, since a part of the gate insulating film 10b is formed on the electric field relaxation layer 56, the maximum electric field intensity of the gate insulating film 10b can considerably be reduced. In the SiC-IGBT in the present embodiment, the on-voltage during current application of 100 A/cm$^2$ was 3.3 V while the maximum electric field intensity of the gate insulating film 10b at off time was approx. 0.1 MV/cm$^2$, which were considerable reduction from the values in each of the aforementioned embodiments.

Figure 5:
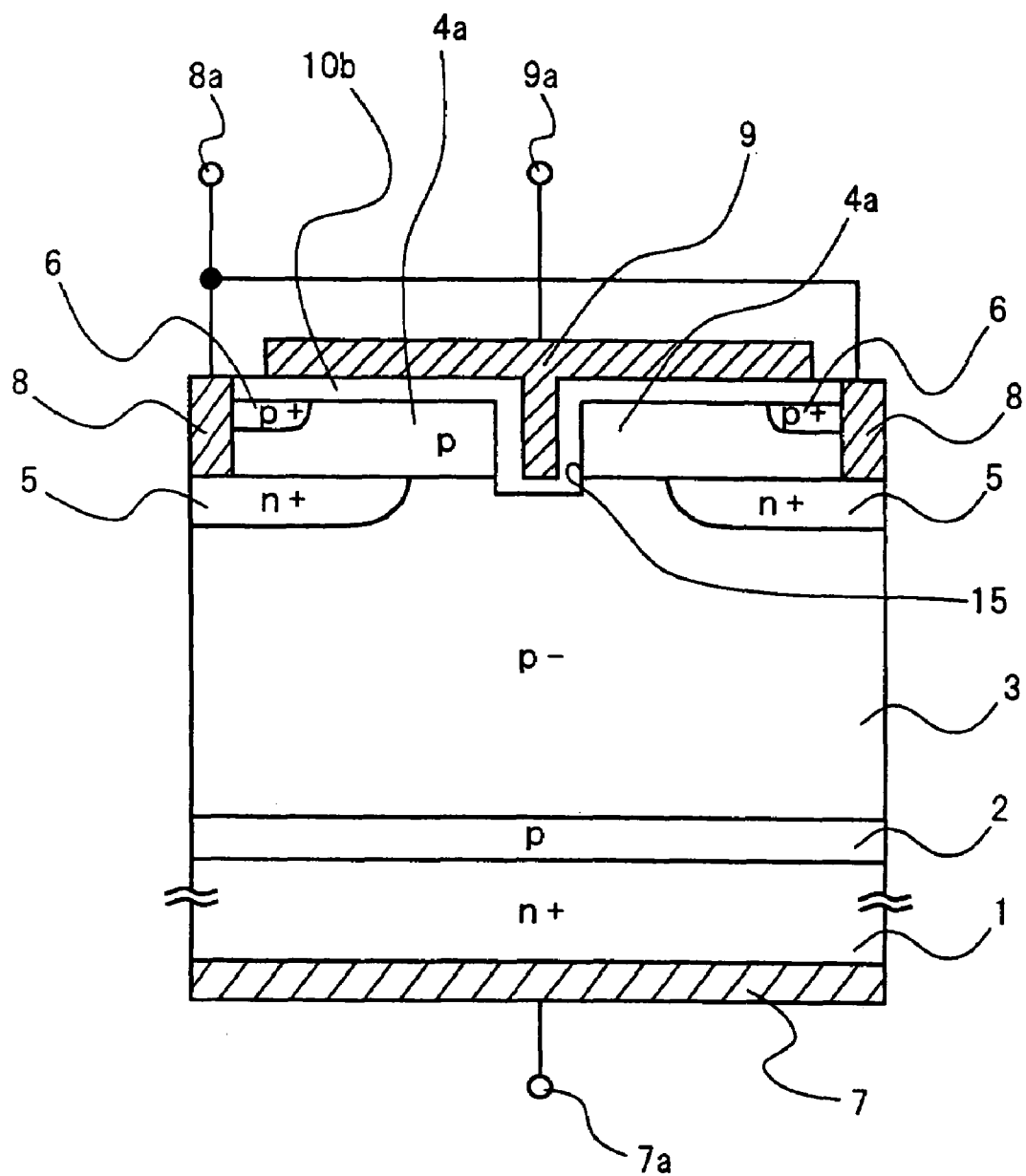
FIG. 5 is a cross sectional view showing an insulated-gate bipolar transistor of another example in a fourth embodiment of the present invention.

A SiC-IGBT in another example of the present embodiment shown in FIG. 5 does not have the electric field relaxation layer 56 in the SiC-IGBT shown in FIG. 4 for the purpose of simplifying the structure. Except the maximum electric field intensity being slightly lower than that of the SiC-IGBT shown in FIG. 4 due to the absence of the electric field relaxation layer 56, the SiC-IGBT in the present example operates in a manner similar to the SiC-IGBT shown in FIG. 4. The SIC-IGBT in the present example also shares the characteristic with the present embodiment, that is, the capability of increasing the base current and decreasing the on-voltage.

In each of the disclosed embodiments, the present invention is also applicable to the voltage-controlled semiconductor device with a structure in which n-type layers and regions are respectively replaced with p-type layers and regions while p-type layers and regions are respectively replaced with n-type layers and regions.

Figure 6:
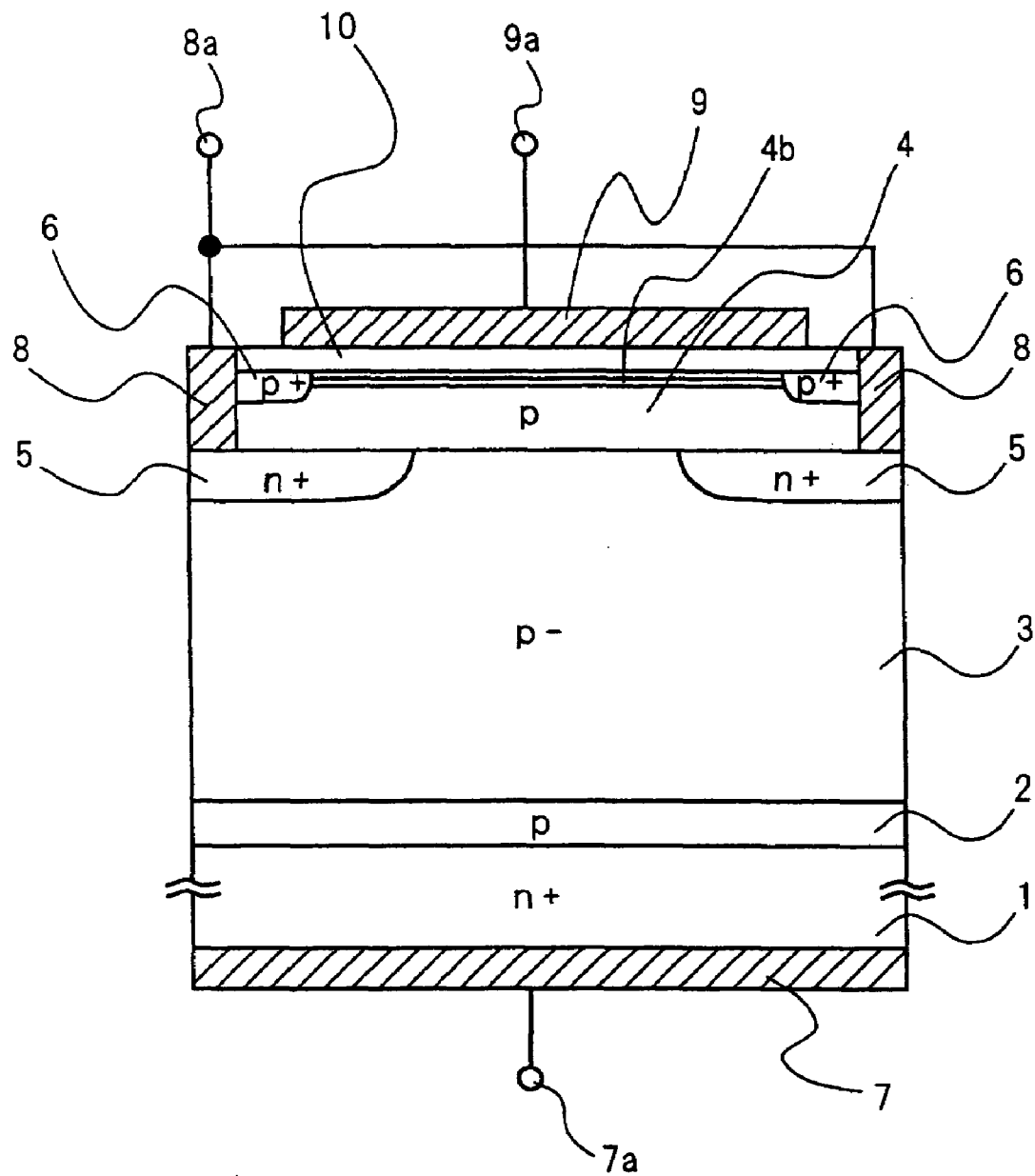
FIG. 6 is a cross sectional view showing a high-conductivity region formed in a channel layer in the first to fourth embodiments of the present invention.
Figure 7:
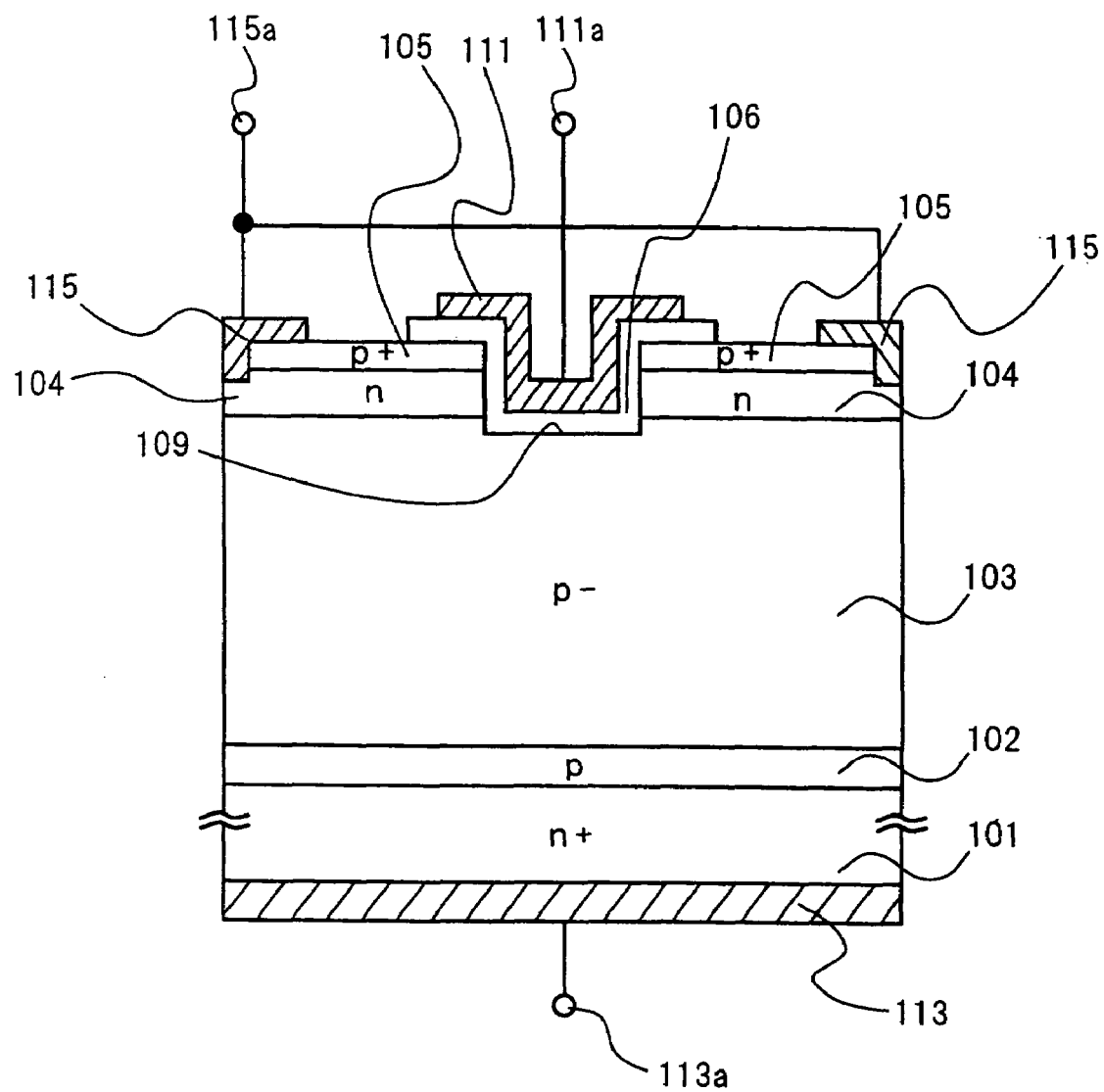
FIG. 7 is a cross sectional view showing a conventional insulated-gate bipolar transistor.

In the voltage-controlled semiconductor device in the first to fourth embodiments, forming the channel layer 4 as an accumulation-type layer allows the channel resistance to become smaller than that in the case of the inversion type layer. Further, as shown in FIG. 6, an effect of further reducing the resistance of the channel layer 4 can be implemented by forming a p-type high-conductivity region 4b with a high dopant concentration on the surface or inside the channel layer 4. The high-conductivity region 4b is formed in a depth of about 0.05 µm to 0.5 µm from the interface between the channel layer 4 and the gate insulating film 10 by epitaxial growth or by implantation of p-type ions such as aluminum ions into the channel layer 4. The depth and the thickness of the high-conductivity region 4b from the surface of the channel layer 4 are determined by depending on the dopant concentration, and therefore the thickness is decreased when the dopant concentration is high and the thickness is increased when the dopant concentration is low so that the channel resistance in the normally-off state can be reduced. One example of the dopant concentration and the thickness of the high-conductivity region 4b is about $3 \times 10^{16}$ cm$^{-3}$ and 0.1 µm, respectively, when the thickness of the channel layer 4 is about 0.3 µm. While FIG. 6 shows the high-conductivity region 4b added to the structure of FIG. 1, the similar effect can be achieved by adding the similar high-conductivity region to the channel layer in the voltage-controlled semiconductor devices in FIG. 2 to FIG. 5.

Moreover, although description has been given in the case of the device with use of SiC as a wide gap semiconductor in each of the embodiments, the present invention is effectively applicable to devices with use of other wide gap semiconductor materials such as diamond and gallium nitride.

INDUSTRIAL APPLICABILITY

The present invention is applicable to insulated-gate bipolar transistor having low on-voltage and high breakdown voltage.

The invention claimed is:

1. A voltage-controlled semiconductor device, comprising:
   a first semiconductor layer made of a first conductivity-type wide gap semiconductor having a first electrode on one surface, the first electrode becoming either one of a current inflow terminal and a current outflow terminal for a controlled current;
   a second semiconductor layer made of a wide gap semiconductor which is formed on the other surface of the first semiconductor layer and which has a second conductivity-type different from the first conductivity type;
   an embedded semiconductor region made of a wide gap semiconductor which is partially provided in a vicinity of an opposite surface of the second semiconductor layer to a surface being in contact with the first semiconductor layer and which has a conductivity type different from that of the second semiconductor layer;
   a channel layer made of a wide gap semiconductor which is provided so as to be in contact with the second semiconductor layer and the embedded semiconductor region and which has a conductivity type identical to that of the second semiconductor layer;
   a semiconductor region made of a wide gap semiconductor which is provided in the channel layer so as to be overlapped with the embedded semiconductor region and which has a conductivity type identical to that of the channel layer and a dopant concentration larger than that of the channel layer;
   a second electrode electrically connected to the embedded semiconductor region and to the semiconductor region, the second electrode becoming a current outflow end when the first semiconductor layer becomes a current inflow end while the second electrode becoming a current inflow end when the first semiconductor layer becomes a current outflow end; and a control electrode facing the channel layer and the semiconductor region via an insulating film.

2. The voltage-controlled semiconductor device according to claim 1, further comprising an electric field relaxation region which is provided in the second semiconductor layer between the adjacent embedded semiconductor regions and which has a conductivity type different from that of the second semiconductor layer.

3. The voltage-controlled semiconductor device according to claim 1,
wherein a portion of the insulating film facing a region between the adjacent embedded semiconductor regions has a thickness larger than other portions.

4. A voltage-controlled semiconductor device, comprising:
a first semiconductor layer made of a first conductivity-type wide gap semiconductor having a first electrode on one surface, the first electrode becoming either one of a current inflow terminal and a current outflow terminal for a controlled .current;
a second semiconductor layer made of a wide gap semiconductor which is formed on the other surface of the first semiconductor layer and which has a second conductivity-type different from the first conductivity type;
at least two embedded semiconductor regions made of a wide gap semiconductor which is partially provided in a vicinity of an opposite surface of the second semiconductor layer to a surface being in contact with the first semiconductor layer and which has a conductivity type different from that of the second semiconductor layer;
a channel layer made of a wide gap semiconductor which is provided so as to be in contact with the second semiconductor layer and the embedded semiconductor regions and which has a conductivity type identical to that of the second semiconductor layer;
a semiconductor region made of a wide gap semiconductor which is provided in the channel layer so as to be overlapped with the embedded semiconductor regions and which has a conductivity type identical to that of the channel layer and a dopant concentration larger than that of the channel layer;
a second electrode electrically connected to the embedded semiconductor regions and to the semiconductor region, the second electrode becoming a current outflow end when the first semiconductor layer becomes a current inflow end while the second electrode becoming a current inflow end when the first semiconductor layer becomes a current outflow end; and a control electrode facing the second semiconductor layer, the channel layer and the semiconductor region via an insulating film.

5. The voltage-controlled semiconductor device according to claim 1,
wherein the first conductivity type is an n type while the second conductivity type is a p type.

6. The voltage-controlled semiconductor device according to claim 4,
wherein the first conductivity type is an n type while the second conductivity type is a p type.

7. The voltage-controlled semiconductor device according to claim 1,
wherein the dopant concentration of the channel layer is larger than the dopant concentration of the second semiconductor layer.

8. The voltage-controlled semiconductor device according to claim 4,
wherein the dopant concentration of the channel layer is larger than the dopant concentration of the second semiconductor layer.

9. The voltage-controlled semiconductor device according to claim 1,
wherein an interval between adjacent embedded semiconductor regions is 3 μm or more.

10. The voltage-controlled semiconductor device according to claim 4,
wherein an interval between adjacent embedded semiconductor regions is 3 μm or more.

11. The voltage-controlled semiconductor device according to claim 4, further comprising an electric field relaxation region which is provided in the second semiconductor layer between the adjacent embedded semiconductor regions and which has a conductivity type different from that of the second semiconductor layer,
wherein the control electrode faces at least a part of the electric field relaxation region via the insulating film.

12. The voltage-controlled semiconductor device according to claim 1,
wherein a high-conductivity region is formed inside the channel layer.

13. The voltage-controlled semiconductor device according to claim 4,
wherein a high-conductivity region is formed inside the channel layer.

* * * * *